(12) United States Patent
Chuang et al.

(10) Patent No.: US 10,134,743 B2
(45) Date of Patent: Nov. 20, 2018

(54) STRUCTURE AND METHOD FOR STATICE RANDOM ACCESS MEMORY DEVICE OF VERTICAL TUNNELING FIELD EFFECT TRANSISTOR

(71) Applicant: Taiwan Semiconductor Manufacturing Company, Ltd., Hsin-Chu (TW)

(72) Inventors: Harry-Hak-Lay Chuang, Singapore (SG); Bao-Ru Young, Zhubei (TW); Ming Zhu, Singapore (SG); Wei Cheng Wu, Zhubei (TW); Yi-Ren Chen, Taoyuan County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 124 days.

(21) Appl. No.: 14/617,550

(22) Filed: Feb. 9, 2015

(65) Prior Publication Data
US 2015/0155286 A1   Jun. 4, 2015

Related U.S. Application Data

(62) Division of application No. 13/792,152, filed on Mar. 10, 2013, now Pat. No. 8,969,949.

(51) Int. Cl.
*H01L 27/11* (2006.01)
*H01L 29/66* (2006.01)
(Continued)

(52) U.S. Cl.
CPC .......... *H01L 27/11* (2013.01); *H01L 27/1104* (2013.01); *H01L 29/0657* (2013.01);
(Continued)

(58) Field of Classification Search
CPC ............. H01L 29/7802; H01L 27/0617; H01L 29/7391; H01L 29/068; H01L 27/2454;
(Continued)

(56) References Cited

U.S. PATENT DOCUMENTS 8,486,808 B2* 7/2013 Nojima ............. H01L 27/10876
257/E21.09
2004/0157353 A1* 8/2004 Ouyang ............. H01L 29/1054
438/38

(Continued)

OTHER PUBLICATIONS

Alan C. Seabaugh, and Qin Zhang, "Low-Voltage Tunnel Transistors for Beyond CMOS Logic" Proceedings of the IEEE, vol. 98, No. 12, Dec. 2010.*

(Continued)

*Primary Examiner* — Matthew Reames
*Assistant Examiner* — John Bodnar
(74) *Attorney, Agent, or Firm* — Haynes and Boone, LLP (57) ABSTRACT

Forming an SRAM cell that includes first and second inverters cross-coupled for data storage, each inverter including at least one pull-up device and at least one pull-down devices; and at least two pass-gate devices configured with the two cross-coupled inverters, the pull-up devices, the pull-down devices and the pass-gate devices include a tunnel field effect transistor (TFET) that further includes a semiconductor mesa formed on a semiconductor substrate and having a bottom portion, a middle portion and a top portion; a drain of a first conductivity type formed in the bottom portion and extended into the semiconductor substrate; a source of a second conductivity type formed in the top portion, the second conductivity type being opposite to the first conductivity type; a channel in a middle portion and interposed between the source and drain; and a gate formed on sidewall of the semiconductor mesa and contacting the channel.

20 Claims, 6 Drawing Sheets (51) Int. Cl.
*H01L 29/78* (2006.01)
*H01L 29/423* (2006.01)
*H01L 29/739* (2006.01)
*H01L 29/06* (2006.01)

(52) U.S. Cl.
CPC .. *H01L 29/42356* (2013.01); *H01L 29/66666* (2013.01); *H01L 29/7391* (2013.01); *H01L 29/7827* (2013.01)

(58) Field of Classification Search
CPC ..... H01L 29/73; H01L 29/06; H01L 29/0657; H01L 29/7371; H01L 29/732; H01L 29/66272; H01L 29/66242; H01L 29/8613; H01L 29/66318; H01L 29/0692; H01L 29/42392; H01L 21/76895
See application file for complete search history.

(56) References Cited

U.S. PATENT DOCUMENTS

| | | | |
|---|---|---|---|
| 2005/0059236 | A1 | 3/2005 | Nishida et al. |
| 2007/0148939 | A1* | 6/2007 | Chu ............... H01L 21/823807 438/590 |
| 2008/0173936 | A1* | 7/2008 | Yoon ............... H01L 21/84 257/329 |
| 2011/0001172 | A1* | 1/2011 | Lee ............... H01L 21/2007 257/288 |
| 2011/0062523 | A1* | 3/2011 | Masuoka ......... H01L 21/823814 257/368 |
| 2011/0253981 | A1* | 10/2011 | Rooyackers ........... B82Y 10/00 257/24 |
| 2013/0058177 | A1* | 3/2013 | Seshadri ............... G11C 29/50 365/201 |
| 2013/0320427 | A1* | 12/2013 | Loh ................... H01L 29/7391 257/327 |
| 2014/0252455 | A1 | 9/2014 | Chuang et al. |

OTHER PUBLICATIONS (Alan C. Seabaugh, and Qin Zhang, "Low-Voltage Tunnel Transistors for Beyond CMOS Logic" Proceedings of the IEEE, vol. 98, No. 12, Dec. 2010).*

Alan C. Seabaugh, and Qin Zhang, "Low-Voltage Tunnel Transistors for Beyond CMOS Logic" Proceedings of the IEEE, vol. 98, No. 12, Dec. 2010, pp. 2095-2011, published Oct. 25, 2010.

* cited by examiner

Fig. 8

STRUCTURE AND METHOD FOR STATICE RANDOM ACCESS MEMORY DEVICE OF VERTICAL TUNNELING FIELD EFFECT TRANSISTOR

PRIORITY INFORMATION

This application is a divisional of U.S. application Ser. No. 13/792,152 filed Mar. 10, 2013, and entitled "Structure and Method for Static Random Access Memory Device of Vertical Tunneling Field Effect Transistor," the disclosure of which is hereby incorporated by reference in its entirety.

BACKGROUND

In deep sub-micron integrated circuit technology, an embedded static random access memory (SRAM) device has become a popular storage unit of high speed communication, image processing and system-on-chip (SOC) products. For example, a dual port (DP) SRAM device allows parallel operation, such as 1R (read) 1W (write), or 2R (read) in one cycle, and therefore has higher bandwidth than a single port SRAM. In advanced technologies with decreased feature size and increased packing density, low loading and high speed of the cell structure are important factors in embedded memory and SOC products. Various gate structures are implemented to achieve high packing density and high speed. For example, a U-shaped gate structure is employed in the SRAM structure. However, the existing structure induces potential issues including pull-down (PD) device variation and integration concerns.

It is therefore desired to have a new structure and method to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1:
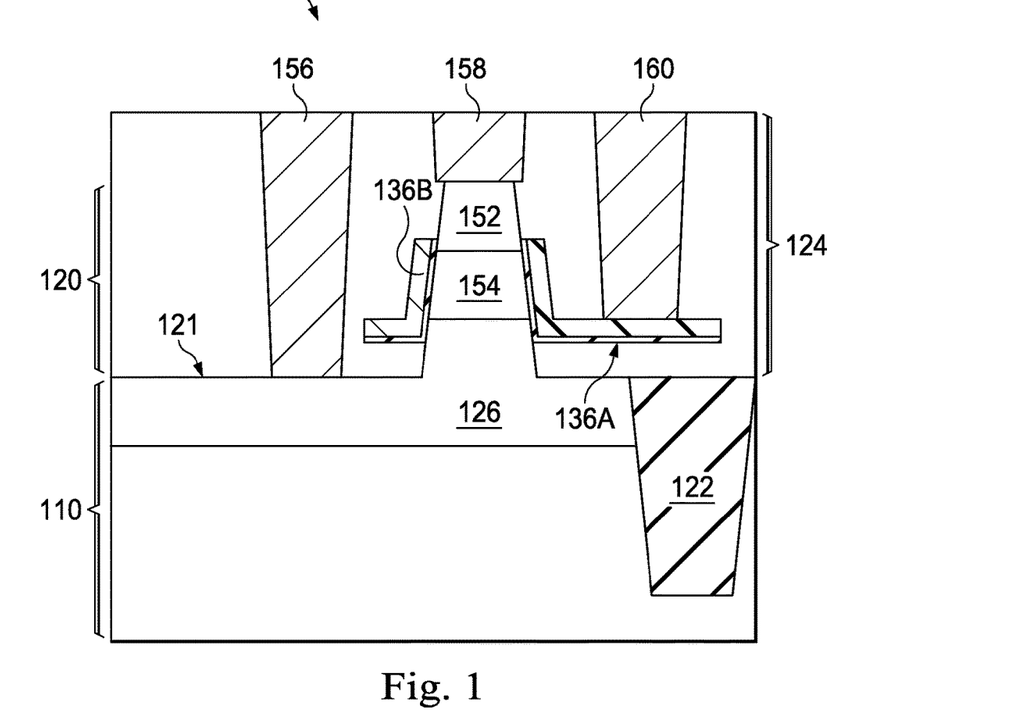
FIG. 1 is a sectional view of a semiconductor structure having a tunnel field effect transistor (TFET) constructed according to one or more embodiment.
Figure 2:
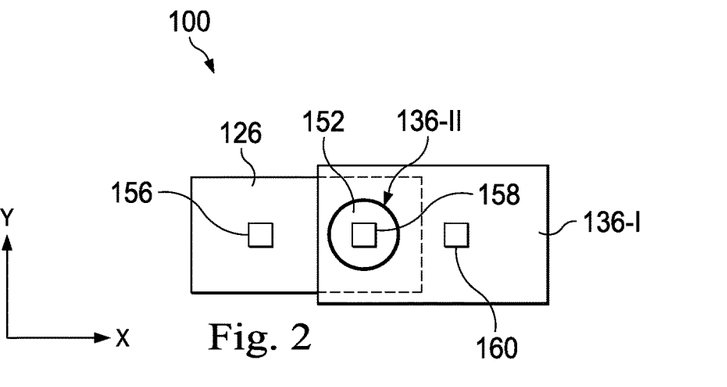
FIG. 2 is a top view of the semiconductor structure of FIG. 1 constructed according to one or more embodiment.
Figure 3:
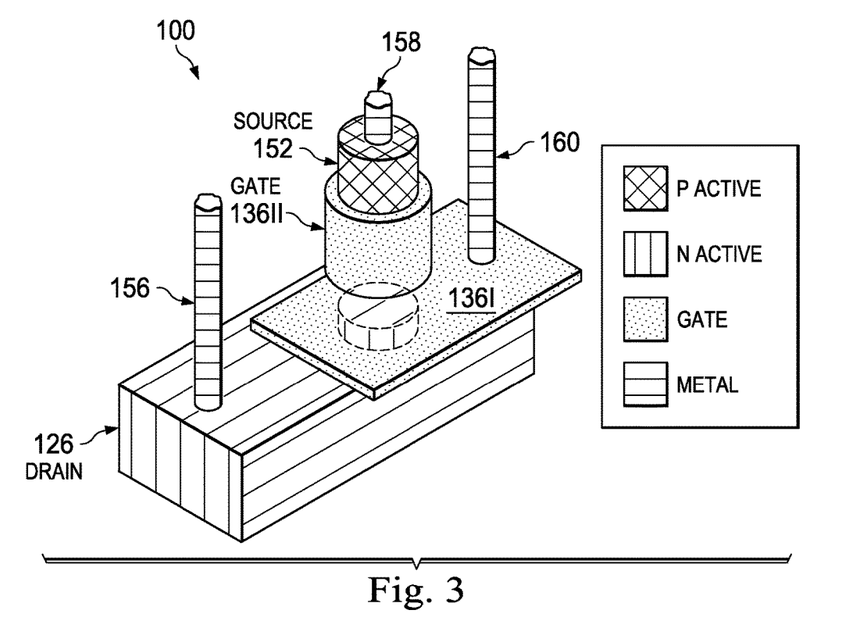
FIG. 3 is a schematic 3D view of the semiconductor structure of FIG. 1 constructed according to one or more embodiment.

FIG. 1 is a sectional view of a semiconductor structure 100 having a tunnel field effect transistor (TFET). FIG. 2 is a top view of the semiconductor structure 100 in portion and FIG. 3 is a schematic 3D view of the semiconductor structure 100 in portion, constructed according to one or more embodiment. The semiconductor structure 100 is described with reference to FIGS. 1 through 3.

The semiconductor structure 100 includes one or more tunnel field effect transistor (TFET). Only one TFET is shown for illustration. In furtherance of the embodiment, the TFET has a vertical structure wherein the channel is vertically configured. The source and drain are vertically disposed with the channel vertically interposed between the source and drain.

The semiconductor structure 100 includes a semiconductor substrate 110 of a first semiconductor material. In the present embodiment, the first semiconductor material is silicon. Alternatively, the first semiconductor material may include other proper semiconductor material. In one embodiment, the semiconductor substrate 110 includes a buried dielectric material layer for isolation formed by a proper technology, such as a technology referred to as separation by implanted oxygen (SIMOX). In some embodiments, the substrate 110 may be a semiconductor on insulator, such as silicon on insulator (SOI).

The semiconductor structure 100 also includes one or more isolation features 122. In the present embodiment, the isolation features 122 are shallow trench isolation (STI) features 122. The STI features 122 are formed in the semiconductor substrate 110 and define various semiconductor regions, or active regions. Various semiconductor regions are separated and isolated from each other by the STI features 122.

The STI features 122 include one or more dielectric materials. For example, the STI features 122 include a lining layer formed by thermal oxidation and a silicon oxide filled by chemical vapor deposition (CVD), such as high density plasma CVD (HDPCVD).

In one embodiment, the formation of the STI features 122 includes: forming a hard mask with openings that define the regions for STI features; etching the semiconductor substrate 110 through the openings of the hard mask to form trenches; depositing a dielectric material to fill in the trenches; and performing a chemical mechanical polishing (CMP) process to remove excessive dielectric material.

The semiconductor structure 100 includes a semiconductor mesa 120 formed on the semiconductor substrate 110. Particularly, the semiconductor mesa 120 is formed in one active region of the semiconductor substrate 110. In one embodiment, the semiconductor mesa 120 includes a semiconductor material same to that of the semiconductor substrate 110. The semiconductor mesa 120 is formed by a procedure including a lithography patterning process and etch in the present embodiment. For example, a hard mask is formed on the semiconductor substrate 110 and is patterned by lithography patterning and etching to define the region for the semiconductor mesa 120. The semiconductor substrate 110 is further etched using the hard mask as an etch mask. In another embodiment, the semiconductor mesa 120 partially includes another semiconductor material different from that of the semiconductor substrate 110 and is formed by a procedure including selective epitaxy growth. For example, the semiconductor mesa 120 includes silicon germanium or germanium, silicon carbide, or other suitable semiconductor material. Alternatively, the semiconductor mesa 120 is totally made of another semiconductor material different from that of the semiconductor substrate 110 and is formed by selective epitaxy growth. For example, a hard mask is formed on the semiconductor substrate 110 and is patterned by lithography patterning and etching to have an opening. A semiconductor material is selectively epitaxy grown on the semiconductor substrate 110 through the opening of the hard mask.

In the present embodiment, an etch process, such as dry etch, is applied to selectively etch the semiconductor substrate 110 using a patterned hard mask as an etch mask. In one embodiment, the etch process is tuned to form the semiconductor mesa 120 having a sidewall profile in a trapezoidal shape. Particularly, the sidewall profile of the semiconductor mesa has a tilting angle less than 90° and greater than 45°, where the tilting angle is measured relative to the top surface 121 of the semiconductor substrate 110. Thus formed the semiconductor mesa 120 has fabrication advantages during the subsequent process steps, such as deposition and/or etches.

The semiconductor mesa 120 may include a round shape in a top view toward the semiconductor substrate 110. In furtherance of the embodiment, the semiconductor mesa 120 is a cylinder or a portion of a cone vertically disposed on the semiconductor substrate 110. The semiconductor mesa 120 has a height as a vertical dimension relative to the top surface 121 of the semiconductor substrate 110. In one example, the height the semiconductor mesa 120 is in the same range for this example.

The semiconductor structure 100 also includes a dielectric material layer 124 disposed on the semiconductor substrate 110 such that the semiconductor mesa 120 is embedded in the dielectric material layer 124. The dielectric material layer 124 includes silicon oxide, low k dielectric material, or other suitable dielectric material for isolation. The dielectric material layer 124 may be formed in several operations along with the formation of other features (such as drain, gate, and source) of the TFET. The formation of the dielectric material layer 124 includes CVD or other suitable technique.

The semiconductor structure 100 includes a drain 126 of the TFET formed by a first ion implantation process. The drain 126 is formed in the bottom portion of the semiconductor mesa 120 and further extended to the semiconductor substrate 110. The drain 126 includes an n-type dopant (such as phosphorous) when the TFET is n-type, or a p-type dopant (such as boron) when the TFET is p-type. In FIG. 3 (and other following figures), a n-type doped drain (or source) is a labeled as "N ACTIVE" that means a n-type doped active region. Similarly, a p-type doped drain (or source) is a labeled as "P ACTIVE" that means a p-type doped active region. Further, the contact features and metal features are labeled as "METAL".

In the present embodiment, the drain 126 includes a horizontal portion and a vertical portion (a portion shown in phantom in FIG. 3, separates the gate 136 from the horizontal portion of the drain). The horizontal portion of the drain is formed in the semiconductor substrate 110. In one example, the horizontal portion has an elongated shape aligned in a first direction (or X direction) as illustrated in FIG. 2. In a particular example, the horizontal portion has a rectangle shape with its longest dimension along the first direction. The vertical portion of the drain 126 is formed in the bottom portion of the semiconductor mesa 120 and contacts with the horizontal portion to form a continuous drain. In the present embodiment, the vertical portion is cylinder or a portion of a cone.

The formation of the drain 126 includes a selective ion implantation. Particularly, the selective implantation includes forming a patterned photoresist layer on the semiconductor substrate 110, performing the ion implantation process using the patterned photoresist layer as an implantation mask, and removing the patterned photoresist layer thereafter by wet stripping or plasma ashing.

The drain 126 formed by the ion implantation is further annealed for activation by an annealing process. The annealing process is implemented right after the ion implantation or is alternatively implemented after the formation of other doped features for collective activation. In one embodiment, the annealing process includes rapid thermal annealing (RTA). In other embodiments, the annealing process alternatively includes laser annealing, spike annealing, million second anneal (MSA) or other suitable annealing technique.

The semiconductor structure 100 includes a gate 136 of the TFET formed around the semiconductor mesa 120, especially around the middle portion of the semiconductor mesa 120, which functions as a channel of the TFET. The gate 136 includes a gate dielectric layer 136A and a gate electrode 136B disposed on the gate dielectric layer.

The gate 136 includes a horizontal portion 136-I and a vertical portion 136-II. The horizontal portion 136-I is disposed on the semiconductor substrate 110 and is separated from the semiconductor substrate by a portion of the dielectric material layer 124. In one example, the horizontal portion 136-I has an elongated shape aligned in the first direction (or X direction) as illustrated in FIG. 2. Specifically, the outline of the horizontal portion 136-I span to form the elongated shape. In a particular example, the horizontal portion 136-I has a rectangle shape with its longest dimension along the first direction.

The vertical portion 136-II is formed on the sidewalls of the semiconductor mesa 120 and contacts with the horizontal portion to form a continuous gate. In the present embodiment, the vertical portion 136-II is a hollow cylinder or a portion of a hollow cone surrounding the middle portion of the semiconductor mesa 120.

In the present embodiment, the gate material layers include high k dielectric material and metal, therefore, referred to as high k metal gate. In one embodiment, the gate dielectric layer 136A includes an interfacial layer (such as silicon oxide) and a high k dielectric material layer. A high k dielectric material is a dielectric material having a dielectric constant greater than that of thermal silicon oxide. For example, a high k dielectric material includes hafnium oxide (HfO) or other suitable metal oxide. The gate electrode 136B includes a metal (or metal alloy) layer and may further include a polycrystalline silicon (polysilicon) layer on the metal layer.

In one embodiment, the formation of the interfacial layer (silicon oxide in the present example) includes thermal oxidation, atomic layer deposition (ALD), CVD or other suitable technology. In another embodiment, the formation of the high k dielectric material layer includes ALD, metalorganic CVD (MOCVD), physical vapor deposition (PVD), or other suitable technology. In yet another embodiment, the formation of the metal layer includes PVD, plating, or other suitable technology. In yet another embodiment, the formation of the polysilicon layer includes CVD or other suitable technology.

Thus formed gate material layers are further patterned to for the gate 136. In one example, the patterning the gate material layers includes forming a patterned photoresist layer on the gate material layers, performing an etch process to the gate material layers using the patterned photoresist layer as an etch mask, and removing the patterned photoresist layer thereafter by wet stripping or plasma ashing. In one example, the etch process includes more than one etch steps using different etchants to etch respective materials in the gate material layers. Each etchant is designed to effectively etch the respective material.

The semiconductor structure 100 also includes a source 152 of the TFET. In the present embodiment, the source 152 is formed in a top portion of the semiconductor mesa 120. Particularly, the drain 126 has a first type conductivity and the source 152 has a second type conductive that is opposite from the first type conductivity. For example, if the first type conductivity is n-type (or p-type), the second type conductivity is p-type (or n-type). In one embodiment where the TFET is n-type, the drain 126 includes a n-type dopant (such as phosphorous) and the source 152 includes a p-type dopant (such as boron). In another embodiment where the TFET is p-type, the drain 126 includes a p-type dopant and the source 152 includes a n-type dopant. In the present embodiment, the source is a cylinder s a portion of cone in as it is formed in the top portion of the semiconductor mesa 120.

In one embodiment, the source 152 is formed by an ion implantation to the semiconductor mesa 120. During the ion implantation, a patterned photoresist layer is formed by a lithography process to function as an implantation mask.

In another embodiment, the formation of the source 152 further includes recessing the semiconductor mesa 120 and epitaxy growing on the recessed semiconductor mesa 120 with a semiconductor material that is different from that of the semiconductor substrate 110. For example, the semiconductor substrate 110 includes silicon and the top portion of the semiconductor mesa 120 includes silicon germanium. Dopant of the source 152 may be introduced by an ion implantation in-situ doping. In the in-situ doping, the epitaxy growth includes a precursor having the corresponding dopant chemical so that the dopant is simultaneously formed during the epitaxy growth. This method may achieve a high doping concentration of the source 152. According to one embodiment, by recessing and epitaxy growth, thus formed source 152 has a smoother interface between the source and the channel. Furthermore, the corresponding junction has an enhanced performance.

The formation of the source 152 may further include an annealing process to anneal the source 152 for activation. The annealing process may be implemented right after the corresponding ion implantation (or epitaxy growth) or is alternatively implemented after the formation of other doped features for collective activation. In various examples, the annealing process includes RTA, laser annealing, spike annealing, MSA, or other suitable annealing technique.

Accordingly, a channel 154 is defined between the source 152 and the drain 126. The channel is defined in the middle portion of the semiconductor mesa 120. The channel 154 is vertically configured so that the current of the TFET vertically flows through the channel 154 from the source 152 to the drain 126. The drain 126, the channel 154 and the source 152 are vertically configured as well.

In one embodiment, the channel 154 is neutral (undoped). In another embodiment, the channel 154 is lightly doped. In one example, the channel 154 has a conductivity type same to the conductivity type of the drain 126. For instance, the channel 154 has a n-type dopant when the TFET is n-type, or the channel 154 has a p-type dopant when the TFET is p-type. In this case, the doping concentration of the channel 154 is substantially less than that of the drain 126.

In the present embodiment, the source 152 has a small overlap with the gate 136 of the TFET to ensure that the channel 154 is completely coupled with and controlled by the gate.

The semiconductor structure 100 also includes various contacts formed on the dielectric material layer 124, landing on respective features of the TFET, and configured to form a functional device (the TFET) or an integrated circuit. In the present embodiment, contacts 156, 158 and 160 are formed in the dielectric material layer 124. Particularly, the contact 156 is configured to land on the drain 126, the contact 158 is configured to land on the source 152, and the contact 160 is configured to land on the gate stack of the TFET. The contacts 156, 158 and 160 are different in term of height. In the present embodiment, the contact 156 lands on the semiconductor substrate 110 and has a first height, the contact 160 lands on the gate 136 (specifically, the horizontal portion 136-I of the gate) and has a second height, and the contact 158 lands on the semiconductor mesa 120 and has a third height. The first height is greater than the second height and the second height is greater than the third height.

The contacts are conductive components in the interconnect structure and provide electrical routing between the devices and the metal line in the vertical direction. In one embodiment, the formation of the contacts along with the dielectric material layer 124 includes depositing one or more dielectric material layer, performing a CMP process to planarize the dielectric material layer, forming a patterned mask layer having a plurality of openings to define the regions for the contacts, etching to form the trenches for the contacts using the patterned mask layer as an etch mask, filling a conductive material in the trenches, and performing another CMP process to remove the excessive conductive material formed on the dielectric material layer. The patterned mask layer may be a patterned hard mask layer or alternatively a patterned photoresist layer. The conductive material of the contacts includes metal, metal alloy or other suitable conductive material. In the present embodiment, the conductive material of the contacts includes tungsten (W). The contacts may further include other material. For example, the contacts include a lining layer, such as titanium nitride or tantalum nitride, formed on the sidewalls of the trenches before the filling of the conductive material to the trenches. The filling of the conductive material in the trenches may use a suitable technology, such as CVD or plating.

The semiconductor structure 100 may further includes other conductive features to form an interconnect structure that provides electric routing and coupling to various devices (including that TFET) to form a functional integrated circuit.

The interconnect structure includes horizontal conductive features (metal lines) and vertical conductive features including vias and contacts (such as contacts 156, 158 and 160). The interconnect structure includes conductive materials such as aluminum, aluminum/silicon/copper alloy, titanium, titanium nitride, tungsten, polysilicon, metal silicide, or combinations, being referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical (via and contact) and horizontal connects (conductive line). Alternatively, a copper multilayer interconnect may be used and include copper, copper alloy, titanium, titanium nitride, tantalum, tantalum nitride, tungsten, polysilicon, metal silicide, or combinations. The copper multilayer interconnect may be formed by a technique such as CVD, sputtering, plating, or other suitable process. The metal silicide used in multilayer interconnects may include nickel silicide, cobalt silicide, tungsten silicide, tantalum silicide, titanium silicide, platinum silicide, erbium silicide, palladium silicide, or combinations thereof. The interconnect structure is formed in an interlayer dielectric (ILD) that provides isolation to various conductive features of the interconnect structure.

The dielectric material layer 124 may serve as a portion of the ILD. In the present embodiment, the dielectric material layer 124 includes multiple dielectric films formed on the semiconductor substrate 110, with the semiconductor mesa 120 and the contacts being embedded therein and being separated from each other. In one example, the dielectric material layer 124 includes first, second and third dielectric films. The first dielectric film is underlying the horizontal portion of the gate and is formed on the semiconductor substrate 110 to define the vertical position of the gate 136 at the bottom end. The second dielectric film is formed on the first dielectric film and defines the vertical position of the gate 136 at the top end. The third dielectric film is formed on the second dielectric film by a procedure including deposition and CMP. In furtherance of the example, each of the first, second, and third dielectric films has a thickness of about ⅓ of that of the dielectric material layer 124. The dielectric material layer 124 includes silicon oxide or a low k dielectric material or other suitable dielectric material. In various embodiment, the dielectric material layer 124 includes silicon oxide, silicon nitride, silicon oxynitride, polyimide, spin-on glass (SOG), fluoride-doped silicate glass (FSG), carbon doped silicon oxide, low-k dielectric material, and/or other suitable materials. The dielectric material layer 124 may be formed by a technique including spin-on, CVD, sputtering, or other suitable processes.

As noted above, the semiconductor structure 100 has a TFET in a certain configuration. The horizontal portion of the drain 126 has an elongated geometry oriented (or aligned) in the first direction, which means that the longer dimension of the horizontal portion of the drain 126 is oriented in the first direction. For example, the horizontal portion of the drain 126 is substantially a rectangle in the top view. The rectangle spans a first dimension (length) in the first direction and a second dimension (width) in a second direction (Y direction) perpendicular to the first direction. The first dimension is greater than the first dimension. Similarly, the horizontal portion of the gate 136 also has an elongated geometry (in the top view) oriented in the first direction (or X direction). In one example, the horizontal portion of the gate 136 is substantially a rectangle in the top view. The length of the horizontal portion of the gate 136 is oriented in the first direction. Furthermore, the contacts (156, 158 and 160) to the drain, gate and source of the TFET are aligned in a line that is oriented in the first direction.

Figure 4:
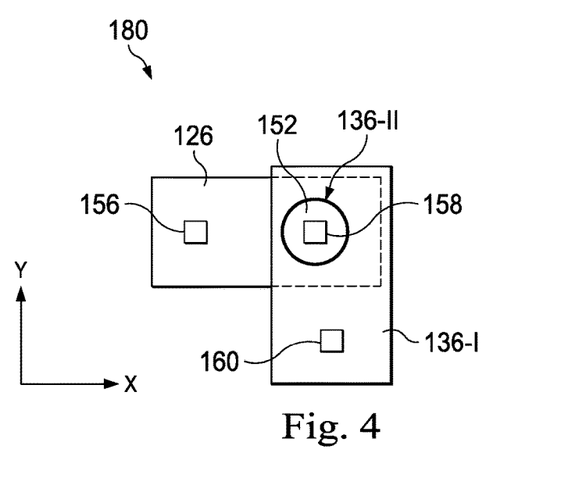
FIG. 4 is a top view of a semiconductor structure having a TFET constructed according to another embodiment.

FIG. 4 is a top view of a semiconductor structure 180 constructed according to various aspects of the present disclosure in another embodiment. The semiconductor structure 180 includes a vertical TFET similar to the TFET in the semiconductor structure 100 in terms of composition and formation. Therefore, similar descriptions are skipped for simplicity. However, the semiconductor structure 180 is different from the semiconductor structure 100 in configuration. In the semiconductor structure 180, the horizontal portion of the drain 126 is oriented in the first direction and the horizontal portion of the gate 136 is oriented in the second direction perpendicular to the first direction. Furthermore, the contacts 156 and 158 are configured in a first line oriented in the first direction and the contacts 158 and 160 are configured in a second line oriented in the second direction that is perpendicular to the first direction.

Figure 5:
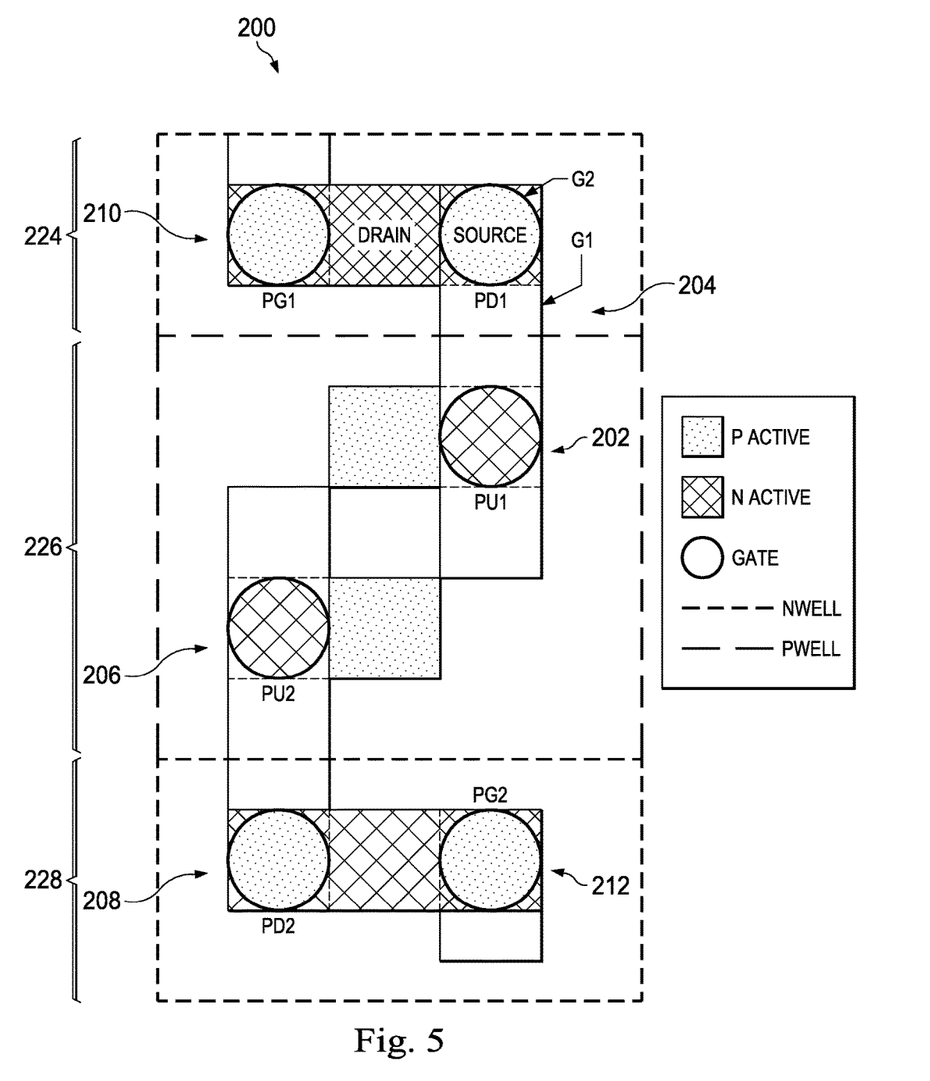
FIG. 5 is a top view of a static random access memory (SRAM) cell, in portion, constructed according to one or more embodiment.
Figure 6:
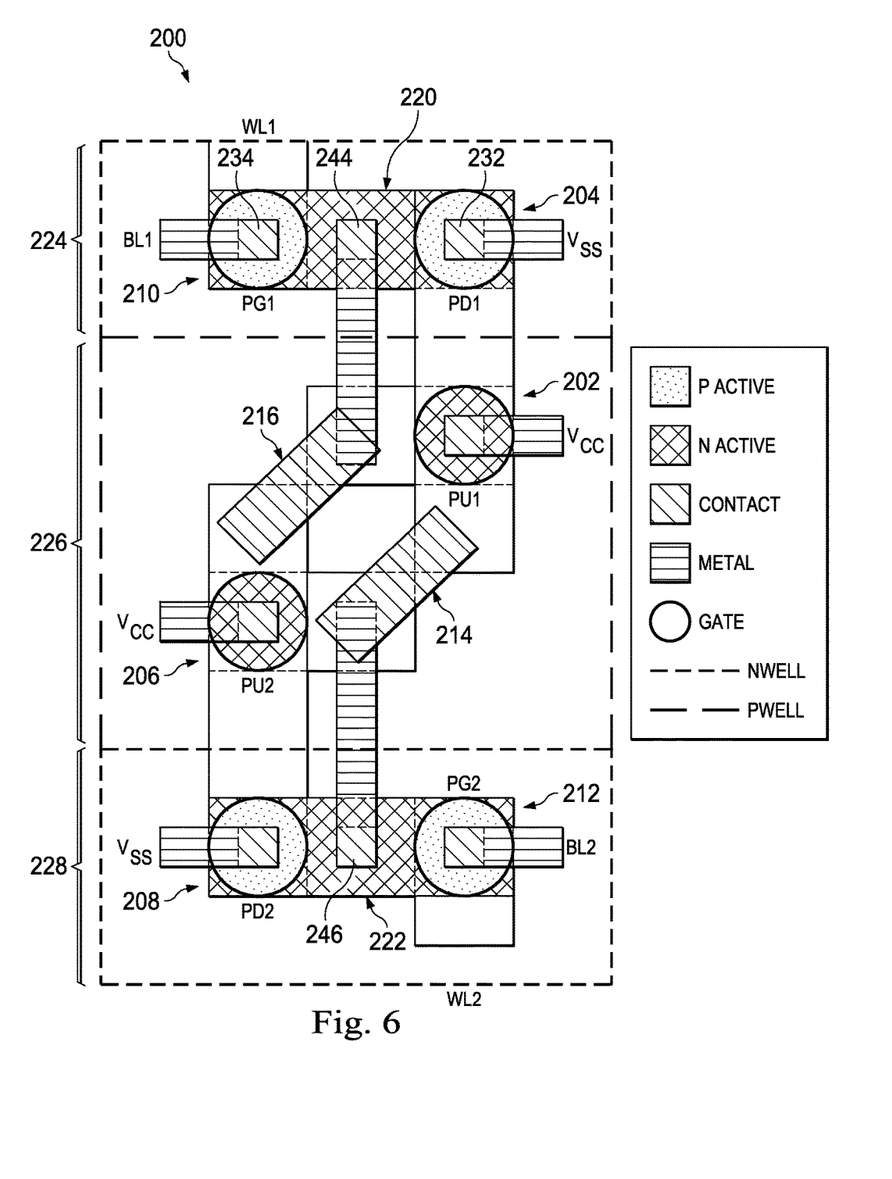
FIG. 6 is a top view of a SRAM cell constructed according to one or more embodiment.
Figure 7:
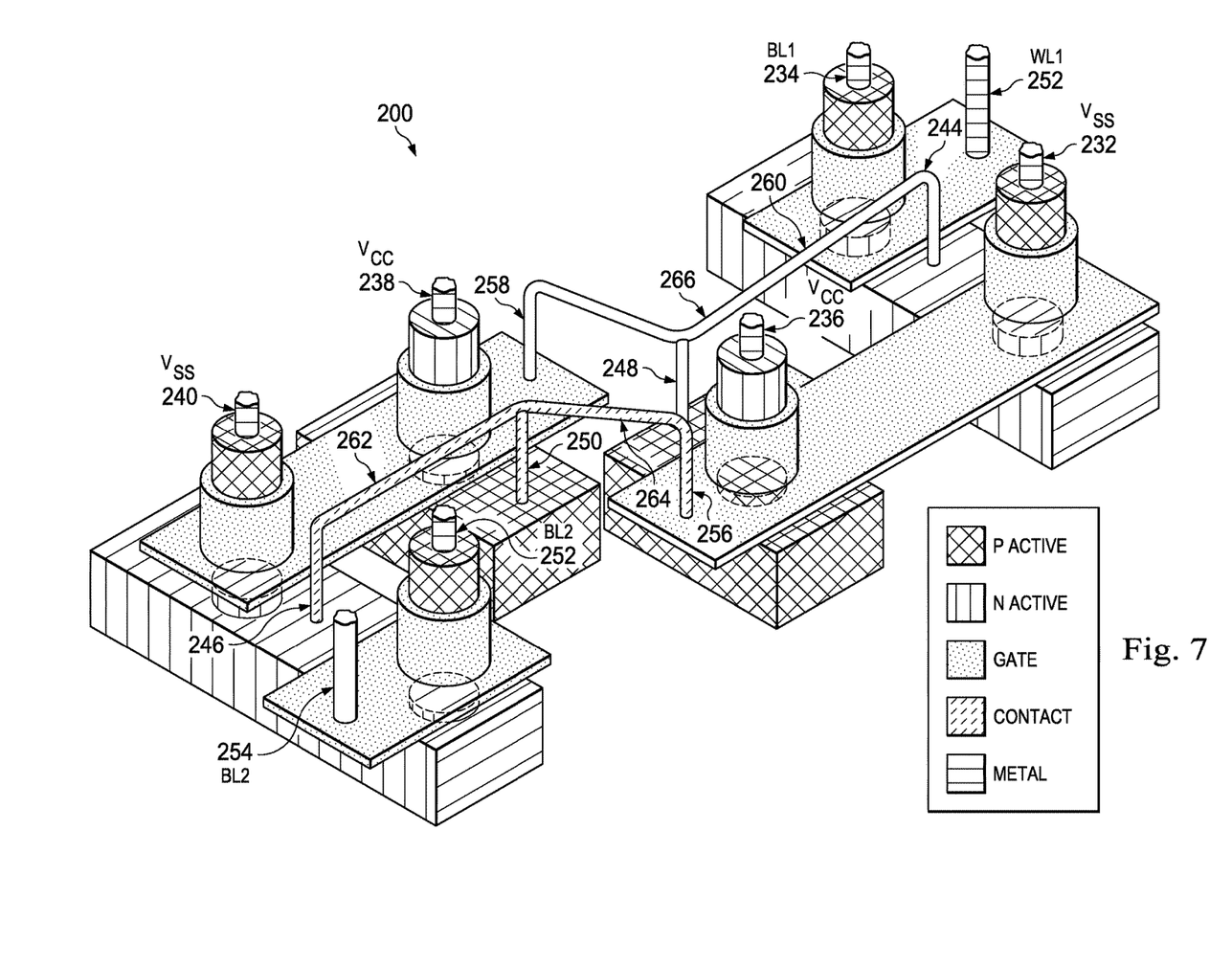
FIG. 7 is a schematic 3D view of the SRAM cell of FIG. 6 constructed according to one or more embodiment.

FIGS. 5 and 6 are top views of a static random access memory (SRAM) cell 200 constructed according to various aspects of the present disclosure in one embodiment. FIG. 7 is a schematic 3D view of the SRAM cell 200 constructed according to various aspects of the present disclosure in one embodiment. For easy to view and understand, FIG. 5 only shows the SRAM cell 200 in portion but FIG. 6 additionally illustrates contacts and other conductive features.

The SRAM cell 200 is a SRAM cell that includes multiple tunnel field-effect transistors or TFETs. The TFETs are vertical TFETs, such as the TFET 100 or the TFET 180. Each TFET is associated with a semiconductor mesa. The SRAM cell 200 includes first and second inverters that are cross-coupled. The first inverter includes a first pull-up device (also referred to as PU1) 202 formed with a p-type TFET (pTFET) and a first pull-down device (also referred to as PD1) 204 formed with a n-type TFET (nTFET). The second inverter includes a second pull-up device (also referred to as PU2) 206 formed with a pTFET and a second pull-down device (also referred to as PD2) 208 formed with a nTFET.

Taking PD1 as an example, the PD1 includes drain "D", source "S" and gate "G" similar to the TFET in the semiconductor structure 100 or 180. Especially, the gate includes a horizontal portion "G1" and a vertical portion "G2". Similar features are not labeled individually for simplicity.

The drains of PU1 and PD1 are electrically connected together, defining a first drain node (or first node). The drains of PU2 and PD2 are electrically connected together, defining a second drain node (or second node). The gates of PU1 and PD1 are electrically connected and coupled to the second node. Specifically, the gates of PU1 and PD1 are electrically connected and coupled to the drains of PU2 and PD2 through a first butted contact 214. The gates of PU2 and PD2 are electrically connected and coupled to the first node. Specifically, the gates of PU2 and PD2 are electrically connected and coupled to the drains of PU1 and PD1 through a second butted contact 216. The sources of PU1 and PU2 are electrically connected to the power line (Vcc line). The sources of PD1 and PD2 are electrically connected to a complementary power line (Vss line). In one embodiment of the SRAM cell layout, the source of PU1 is electrically connected to a first Vcc line while the source of PU2 is electrically connected to a second Vcc line. In another embodiment of the SRAM cell layout, the source of PD1 is electrically connected to a first Vss line while the source of PD2 is electrically connected to a second Vss line.

The SRAM cell 200 further includes a first port and a second port. In the embodiment, the first port includes a first pass-gate device (PG1) 210 and the second port includes a second pass-gate device (PG2) 212. In the present embodiment, the PG1 and PG2 are nTFETs. The source of PG1 is electrically connected to a first bit-line (referred to as BL1 in FIGS. 6 and 7). The drain of PG1 is electrically connected to the first node. Particularly, the PG1 and the PD1 share a first common drain 220. The gate of PG1 is electrically connected to a first word-line (referred to as WL1 in FIGS. 6 and 7).

Similarly, the source of PG2 is electrically connected to a second bit-line (referred to as BL2 in FIGS. 6 and 7). The drain of PG2 is electrically connected to the second node. Particularly, the PG2 and the PD2 share a second common drain 222. The gate of PG2 is electrically connected to a second word-line (referred to as WL2 in FIGS. 6 and 7).

The SRAM cell 200 includes a first active region 224, a second active region 226, and a third active region 228 configured such that the second active region 226 is between the first and third active regions (224 and 228). PG1 and PD1 are formed in the first active region 224. PU1 and PU2 are formed in the second active region 226. PG2 and PD2 are formed in the third active region 228. In the present embodiment, the first and third active regions are doped with n-type dopant (also referred to as n-type wells) and the second active region is doped with p-type dopant (also referred to as p-type well). In an alternative embodiment, the first and third active regions are doped with p-type dopant (also referred to as p-type wells) and the second active region is doped with n-type dopant (also referred to as n-type well) to provide pn junction isolation from the substrate.

The SRAM cell 200 may include additional devices such as additional pull-down devices and pass-gate devices. In the present embodiment, each of pull-down devices, pull-up devices and pass-gate devices includes a TFET. In furtherance of the embodiment, the total number of the TFETs in the SRAM cell 200 is 6. Each TFET is formed in and around a semiconductor mesa.

In the present embodiment, the SRAM cell 200 includes a first semiconductor mesa for PD1 and a second semiconductor mesa for PG1, both semiconductor mesas being disposed in the first active region 224. The SRAM cell 200 includes a third semiconductor mesa for PU1 and a fourth semiconductor mesa for PU2, both semiconductor mesas being disposed in the second active region 226. The SRAM cell 200 includes a fifth semiconductor mesa for PD2 and a sixth semiconductor mesa for PG2, both semiconductor mesas being disposed in the third active region 228.

Especially, each TFET in the SRAM cell 200 is similar to the TFET in the semiconductor structure 180 and has an orthogonal configuration. In the top view of each TFET, the horizontal portion of the drain is oriented in a first direction and the horizontal portion of the gate is oriented in a second direction perpendicular to the first direction. Furthermore, the corresponding source contact and drain contact are configured in a first line oriented in the first direction. The source contact and gate contact are configured in a second line oriented in the second direction.

Contacts are further described, each source has a respective source contact formed on the top portion of the respective semiconductor mesa, such as source contact 232 to the source of PD1 and further connected to Vss, source contact 234 to the source of PG1 and further connected to BL1, source contact 236 to the source of PU1 and further connected to Vcc, source contact 238 to the source of PU2 and further connected to Vcc, source contact 240 to the source of PD2 and further connected to Vss, and source contact 242 to the source of PG2 and further connected to BL2.

The drain contacts includes first drain contact 244 formed on the common drain 220 of the PG1 and PD1; second drain contact 246 formed on the common drain 222 of the PG2 and PD2; third drain contact 248 for PU1 and fourth drain contact 250 for PU2. The SRAM cell 200 also includes two butted contacts 214 and 216. In the present embodiment, the butted contacts each include vertical conductive features and horizontal conductive feature as illustrated in FIG. 7.

The SRAM cell 200 includes gate contacts, such as gate contact 252 to the gate of PG1 and further connected to WL1, gate contact 254 to the gate of PG2 and further connected to WL2, gate contact 256 to the common gate of PD1 and PU1, and gate contact 258 to the common gate of PD2 and PU2.

The SRAM cell 200 further includes horizontal conductive features (such as metal lines) to connect and couple various drains, sources, and gates through the contacts. For example, the SRAM cell 200 includes a metal line 260 to connect the contacts 244 and 248, and a metal line 262 to connect the contacts 246 and 250. In the embodiment illustrated in FIG. 7, the contacts 250, 256 and metal line 264 collectively form a butted contact 214. The contacts 248, 258 and metal line 266 collectively form a butted contact 216. As noted above, the source contacts, gate contacts and drain contacts have respective heights.

Figure 8:
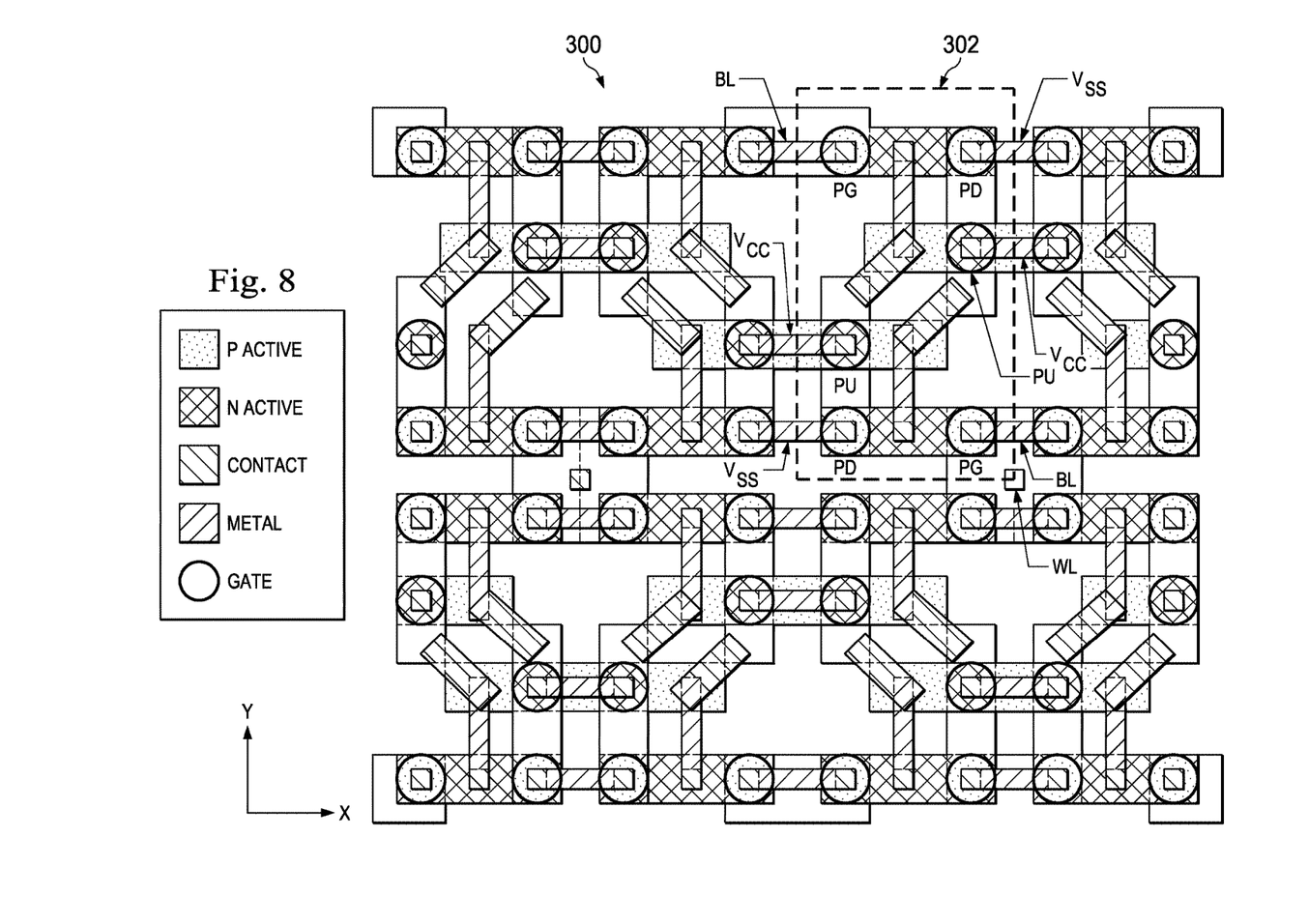
FIG. 8 is a top view of a SRAM structure constructed according to one or more embodiment.

FIG. 8 is a top view of a SRAM structure 300 having multiple SRAM cells constructed according to various aspects of the present disclosure in one embodiment. In one embodiment, the SRAM structure 300 includes 8 SRAM cells, each of which is similar to the SRAM cell 200. One SRAM cell 302 is highlighted in a region by dashed lines The SRAM cell 302 is formed in a unit cell region of the semiconductor substrate. In one embodiment, the unit cell region is defined in a rectangular shape spanning to a first dimension in a first direction (X direction) and spanning to a second dimension in a second direction (Y direction) perpendicular to the first direction. The second dimension is greater than the first dimension. The first and second dimensions are referred to as a short pitch and a long pitch, respectively. In one embodiment, a SRAM array having a plurality of cells is configured to form a two-dimensional periodic structure with periodic constants as the short pitch and long pitch in the first and second directions, respectively.

Thus, the present disclosure provides one embodiment of a static random access memory (SRAM) cell. The SRAM cell includes first and second inverters cross-coupled for data storage, each inverter including at least one pull-up device and at least one pull-down devices; and at least two pass-gate devices configured with the two cross-coupled inverters. The pull-up devices, the pull-down devices and the pass-gate devices include a tunnel field effect transistor (TFET) that further includes a semiconductor mesa formed on a semiconductor substrate and having a bottom portion, a middle portion and a top portion; a drain of a first conductivity type formed in the bottom portion of the semiconductor mesa and extended into the semiconductor substrate; a source of a second conductivity type formed in the top portion of the semiconductor mesa, the second conductivity type being opposite to the first conductivity type; a channel in a middle portion of the semiconductor mesa and interposed between the source and drain; and a gate formed on sidewall of the semiconductor mesa and contacting the channel.

The present disclosure also provides another embodiment of a static random access memory (SRAM) cell that includes first and second inverters cross-coupled for data storage, wherein the first inverter includes a first pull-up (PU) tunnel field effect transistor (TFET) and a first pull-down (PD) TFET, and the second inverter includes a second PU TFET and a second PD TFET; and first and second pass-gate (PG) TFETs coupled with the first and second inverters, serving as two ports of the SRAM cell. Each TFET of the PU TFETs, PD TFETs and PG TFETs further include a semiconductor mesa formed on a semiconductor substrate and having a bottom portion, a middle portion and a top portion; a drain of a first conductivity type formed in the bottom portion of the semiconductor mesa and extended into the semiconductor substrate; a source of a second conductivity type formed in the top portion of the semiconductor mesa, the second conductivity type being opposite to the first conductivity type; a channel in a middle portion of the semiconductor mesa and interposed between the source and drain; and a gate formed on sidewall of the semiconductor mesa and contacting the channel.

The present disclosure also provides another embodiment of a method of forming a static random access memory (SRAM) cell having a tunnel field effect transistor (TFET). The method includes forming a first n-type well and a second n-type well in a semiconductor substrate; forming a p-type well in the semiconductor substrate, wherein the p-type well is interposed between the first and second n-type wells; forming semiconductor mesas on the semiconductor substrate, wherein first and second semiconductor mesas are disposed in the first n-type well, third and fourth semiconductor mesas are disposed in the second n-type well, and fifth and sixth semiconductor mesas are disposed in the p-type well; forming first, second, third, fourth, fifth and sixth TFETs on the first, second, third, fourth, fifth and sixth semiconductor mesas, respectively, wherein the TFETs each include a source and a drain having opposite conductivity types, the first, second, third and fourth TFETs are n-type TFETs, and the fifth and sixth TFETs are p-type TFETs; and forming contacts configured to couple the TFETs to the SRAM cell, wherein the contacts include source contacts having a first height, gate contacts having a second height and drain contacts having a third height, and the second height is greater than the first height and the third height is greater than the second height.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for fabricating a static random access memory (SRAM) cell, the method comprising:
    forming a first inverter and second inverter, the first inverter and the second invertor being cross-coupled for data storage, each inverter including at least one pull-up (PU) device and at least one pull-down (PD) device; and
    forming at least two pass-gate (PG) devices configured with the first inverter and the second inverter, wherein the pull-up devices, the pull-down devices and the pass-gate devices each include a tunnel field effect transistor (TFET) that further includes:
        a semiconductor mesa formed on a semiconductor substrate and having a bottom portion, a middle portion and a top portion;
        a first source or drain of a first conductivity type formed in the bottom portion of the semiconductor mesa and extended into the semiconductor substrate;
        a second source or drain of a second conductivity type formed in the top portion of the semiconductor mesa, the second conductivity type being opposite to the first conductivity type;
        a channel in a middle portion of the semiconductor mesa and interposed between the source and drain; and
        a gate formed on sidewall of the semiconductor mesa and contacting the channel;
    wherein the gates for the PU TFET and the PD TFET of the first inverter include a cylindrical portion in direct contact with an elongated plate such that the elongated plate is shared between the PU TFET and the PD TFET of the first inverter, the elongated plate comprising a gate dielectric layer and a gate electrode layer on the gate dielectric layer, the cylindrical portion extending above the elongated plate, the elongated plate being wider than a diameter of the cylindrical portion, a bottom of the gate dielectric layer being above a bottom of the semiconductor mesa and below the channel such that an interlayer dielectric layer is disposed above the gate dielectric layer and between the bottom of the gate dielectric layer and the bottom of the semiconductor mesa.

2. The method of claim 1, further comprising
    forming a first contact landing on the gate of one of the TFETs;
    forming a second contact landing on the second source or drain of one of the TFETs; and
    forming a third contact landing on the first source or drain of one of the TFETs, wherein the second contact to the second source or drain is disposed in a common region of the first source or drain and the gate in a top view.

3. The method of claim 2, wherein the first, second and third contacts are configured in a line oriented in a first direction in the top view.

4. The method of claim 3, wherein the second contact to the second source or drain is interposed between the first contact to the gate and the third contact to the first source or drain in the top view.

5. The method of claim 2, wherein the semiconductor mesa is substantially in a round shape in the top view.

6. The method of claim 5, wherein:
    the drain includes a first horizontal portion and a first vertical portion disposed on the first horizontal portion,
    the first horizontal portion is an elongated plate formed in the semiconductor substrate and aligned in the first direction; and
    the first vertical portion is substantially a cylinder formed in the semiconductor mesa.

7. The method of claim 6, wherein:
    the gate includes a second horizontal portion and a second vertical portion disposed on the second horizontal portion,
    the second horizontal portion is an elongated plate formed on a dielectric material layer and aligned in the first direction; and
    the second vertical portion is a hollow cylinder formed on sidewall of the middle portion of the semiconductor mesa.

8. The method of claim 2, wherein in the top view, the first and second contacts are configured in a first line oriented in a first direction, and the second and third contacts are configured in a second line oriented in a second direction that is orthogonal to the first direction.

9. The method of claim 1, wherein the PU devices, the PD devices and the PG devices collectively include:
a first PD TFET and a first PG TFET disposed in a first n-well region;
a second PD TFET and a second PG TFET disposed in a second n-well region; and
a first PU TFET and a second PU TFET disposed in a p-well region that is interposed between the first and second n-well regions, wherein:
the first PD TFET and the first PG TFET share a first common drain, and
the second PD TFET and the second PG TFET share a second common drain.

10. The method of claim 9, further comprising:
forming a first gate disposed on the first n-well region and the p-well region, serving as a first common gate to the first PD TFET and the first PU TFET; and
forming a second gate disposed on the second n-well region and the p-well region, serving as a second common gate to the second PD TFET and the second PU TFET.

11. The method of claim 10, wherein:
the second source or drain of the first PD TFET and the second source or drain of the first PU TFET are formed directly on the first gate; and
the second source or drain of the second PD TFET and the second source or drain of the second PU TFET are formed directly on the second gate.

12. The method of claim 11, wherein:
the first and second PD TFETs are n-type TFETs;
the first and second PU TFETs are p-type TFETs;
the first and third sources have a p-type conductivity; and
the second and fourth sources have a n-type conductivity.

13. The method of claim 12, further comprising
forming a first butted contact landing on the first gate and a first drain of the second PU TFET; and
forming a second butted contact landing on the second gate and a second drain of the first PU TFET.

14. for forming static random access memory (SRAM) cell, the method comprising:
forming first and second inverters cross-coupled for data storage, wherein the first inverter includes a first pull-up (PU) tunnel field effect transistor (TFET) and a first pull-down (PD) TFET, and the second inverter includes a second PU TFET and a second PD TFET; and
forming first and second pass-gate (PG) TFETs coupled with the first and second inverters, serving as two ports of the SRAM cell,
wherein each TFET of the PU TFETs, PD TFETs and PG TFETs further include:
a semiconductor mesa formed on a semiconductor substrate and having a bottom portion, a middle portion and a top portion;
a drain of a first conductivity type formed in the bottom portion of the semiconductor mesa and extended into the semiconductor substrate;
a source of a second conductivity type formed in the top portion of the semiconductor mesa, the second conductivity type being opposite to the first conductivity type;
a channel in a middle portion of the semiconductor mesa and interposed between the source and drain; and
a gate formed on sidewall of the semiconductor mesa and contacting the channel;
wherein the gates for the PU TFET and the PD TFET of the first inverter include a cylindrical portion in direct contact with an elongated plate such that the elongated plate is shared between the PU TFET and the PD TFET of the first inverter, the elongated plate comprising a gate dielectric layer and a gate electrode layer on the gate dielectric layer, the cylindrical portion extending above the elongated plate, the elongated plate being wider than a diameter of the cylindrical portion, a bottom of the gate dielectric layer being above a bottom of the semiconductor mesa and below the channel such that an interlayer dielectric layer is disposed above the gate dielectric layer and between the bottom of the gate dielectric layer and the bottom of the semiconductor mesa.

15. The method of claim 14, further comprising
forming a first contact landing on the gate and having a first height;
forming a second contact landing on the source and having a second height; and
forming a third contact landing on the drain and having a third height,
wherein the second height is less than the third height and is greater than the first height.

16. The method of claim 15, wherein the second contact is disposed in a common region of the drain and the gate in a top view.

17. The method of claim 15, wherein in the top view
the first and second contacts are configured in a first line oriented in a first direction, and
the second and third contacts are configured in a second line oriented in a second direction that is orthogonal to the first direction.

18. A method of forming a static random access memory (SRAM) cell having a tunnel field effect transistor (TFET), the method comprising:
forming a first n-type well and a second n-type well in a semiconductor substrate;
forming a p-type well in the semiconductor substrate, wherein the p-type well is interposed between the first and second n-type wells;
forming semiconductor mesas on the semiconductor substrate, wherein first and second semiconductor mesas are disposed in the first n-type well, third and fourth semiconductor mesas are disposed in the second n-type well, and fifth and sixth semiconductor mesas are disposed in the p-type well;
forming first, second, third, fourth, fifth and sixth TFETs on the first, second, third, fourth, fifth and sixth semiconductor mesas, respectively, wherein
the TFETs each include a source and a drain having opposite conductivity types,
the first, second, third and fourth TFETs are n-type TFETs, and
the fifth and sixth TFETs are p-type TFETs; and
forming contacts configured to couple the TFETs to the SRAM cell, wherein
the contacts include source contacts having a first height, gate contacts having a second height and drain contacts having a third height, and
the second height is greater than the first height and the third height is greater than the second height;

wherein gates for the PU TFET and the PD TFET of the first inverter include a cylindrical portion in direct contact with an elongated plate such that the elongated plate is shared between the PU TFET and the PD TFET of the first inverter, the elongated plate comprising a gate dielectric layer and a gate electrode layer on the gate dielectric, the cylindrical portion extending above the elongated plate, the elongated plate being wider than a diameter of the cylindrical portion, a bottom of the gate dielectric layer being above a bottom of the semiconductor mesa and below the channel such that an interlayer dielectric layer is disposed above the gate dielectric layer and between the bottom of the gate dielectric layer and the bottom of the semiconductor mesa.

19. The method of claim 18, wherein the forming of first, second, third, fourth, fifth and sixth TFETs includes performing a first ion implantation of n-type dopant to form drains of the n-type TFETs;

performing a second ion implantation of p-type dopant to form drains of the p-type TFETs;

performing a third ion implantation of p-type dopant to form sources of the n-type TFETs; and performing a fourth ion implantation of n-type dopant to form sources of the p-type TFETs.

20. The method of claim 18, wherein the forming of first, second, third, fourth, fifth and sixth TFETs includes forming drains of the TFETs on the semiconductor mesas;

forming a first dielectric layer on the semiconductor substrate and sidewalls of the semiconductor mesas;

forming gate stack on the sidewalls of the semiconductor mesas and the first dielectric layer;

forming a second dielectric layer on the first dielectric layer and the gate stacks; and forming sources of the TFETs on portions of the semiconductor mesas.

* * * * *